US008756465B2

(12) United States Patent
Akita

(10) Patent No.: US 8,756,465 B2
(45) Date of Patent: Jun. 17, 2014

(54) TEST MODULE AND A TEST METHOD FOR READING A NUMBER OF FAILS FOR A DEVICE UNDER TEST (DUT)

(75) Inventor: Tokunori Akita, Saitama (JP)

(73) Assignee: Advantest Corporation, Tokyo (JP)

( * ) Notice: Subject to any disclaimer, the term of this patent is extended or adjusted under 35 U.S.C. 154(b) by 644 days.

(21) Appl. No.: 13/015,481

(22) Filed: Jan. 27, 2011

(65) Prior Publication Data

US 2011/0145664 A1 Jun. 16, 2011

Related U.S. Application Data

(63) Continuation of application No. PCT/JP2009/003866, filed on Aug. 11, 2009.

(30) Foreign Application Priority Data

Aug. 14, 2008 (JP) .................................. 2008-209080

(51) Int. Cl.
G11C 29/00 (2006.01)

(52) U.S. Cl.
USPC .......................................... 714/723; 714/719

(58) Field of Classification Search
CPC .......................... G11C 29/56; G11C 29/56008
USPC ................................... 714/718, 719, 723
See application file for complete search history.

(56) References Cited

U.S. PATENT DOCUMENTS

| 6,836,863 | B2* | 12/2004 | Tabata et al. | ..................... | 714/719 |
| 7,984,345 | B2* | 7/2011 | Ozawa et al. | .................... | 714/723 |
| 2002/0054528 | A1 | 5/2002 | Tabata et al. | | |
| 2007/0162795 | A1 | 7/2007 | Hasegawa | | |
| 2008/0052015 | A1 | 2/2008 | Ozawa et al. | | |

FOREIGN PATENT DOCUMENTS

| JP | H1-205798 A | 8/1989 |
| JP | H11-96792 A | 4/1999 |
| JP | 2002-056692 A | 2/2002 |
| JP | 2006-012253 A | 1/2006 |
| JP | 2011-23058 A | 2/2011 |

OTHER PUBLICATIONS

Japanese Office Action dated May 8, 2012, in a counterpart Japanese patent application No. 2008-209080. (This Japanese OA cites Foreign Patent document Nos. 1-3 above and JP2006-12253 and JP2002-56692 which have been submitted in a previous IDS. (A machine translation (not reviewed for accuracy) attached.)).
CN Office Action and English Translation Dated Nov. 27, 2012; Application No. 200980131218.8.
English translation of Written Opinion (PCT/ISA/237) issued in PCT/JP2009/003866 (parent application) mailed in Mar. 2011. Japanese Written Opinion has been submitted in a previous IDS.
International Search Report (ISR) issued in PCT/JP2009/003866 (parent application) mailed in Sep. 2009 for Examiner consideration, citing U.S. Patent No. 1, U.S. Patent Application Publication No. 1 and Foreign Patent document No. 2 listed above.
Written Opinion (PCT/ISA/237) issued in PCT/JP2009/003866 (parent application) mailed in Sep. 2009. Concise Explanation of Relevance: This Written Opinion considers the claims are described by or obvious over the Foreign Patent document No. 2 cited in ISR above.

* cited by examiner

Primary Examiner — James C Kerveros

(57) ABSTRACT

Provided is a test module that tests a device under test, comprising a pattern generating section that generates a test pattern supplied to the device under test and an expected value pattern corresponding to the test pattern, based on a pattern program; an output pattern acquiring section that acquires an output pattern output by the device under test in response to the test pattern; a comparing section that compares the output pattern output and the expected value pattern; a fail counter that counts the number of times the comparing section indicates a mismatch between the output pattern and the expected value pattern; and a control section that controls operation of the fail counter according to control instructions in the pattern program.

14 Claims, 1 Drawing Sheet

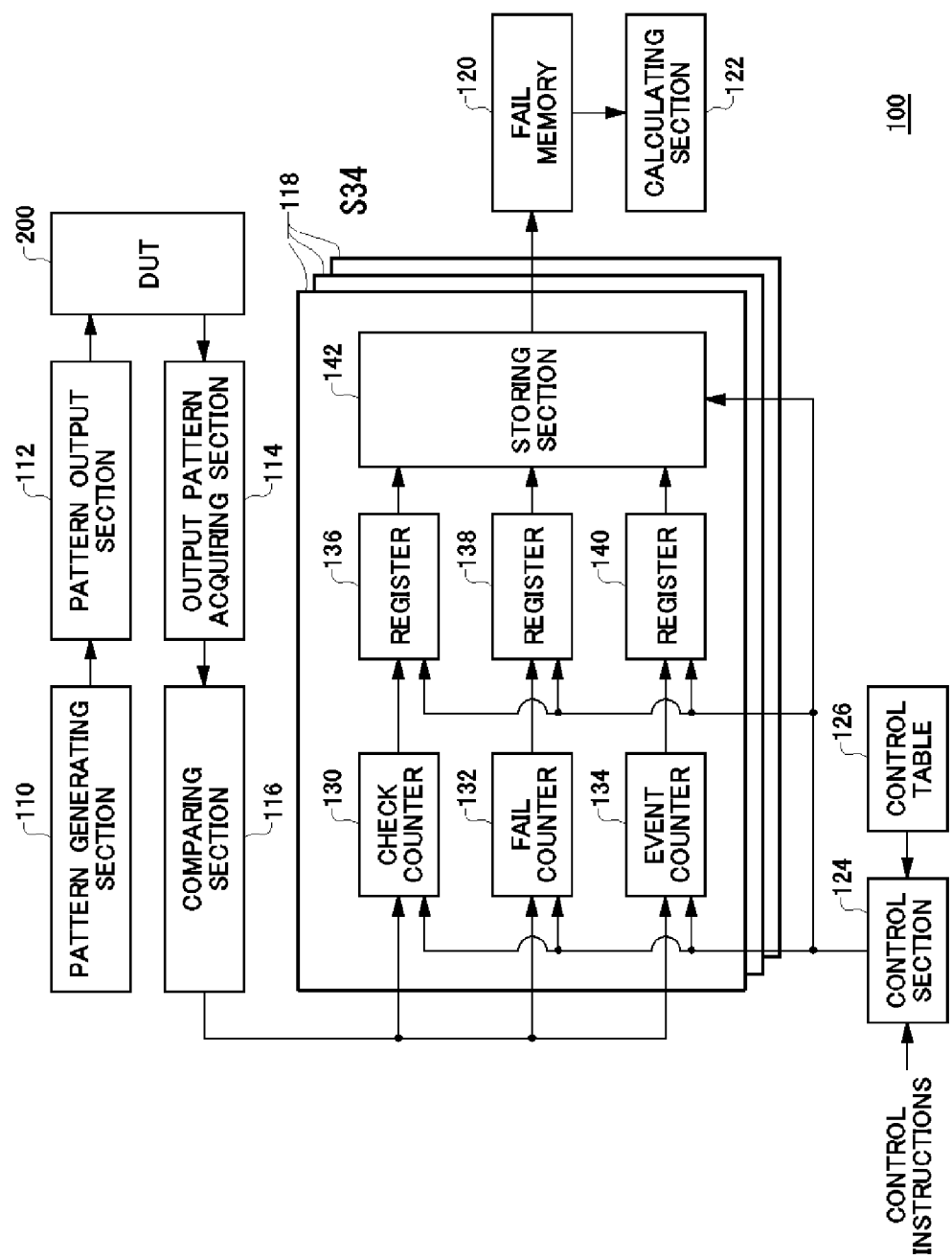

TEST MODULE AND A TEST METHOD FOR READING A NUMBER OF FAILS FOR A DEVICE UNDER TEST (DUT)

BACKGROUND

1. Technical Field

The present invention relates to a test module and a test method. In particular, the present invention relates to a test module and a test method that can read, at high-speed, the number of fails accumulated for each channel and measured at any intervals.

2. Related Art

Patent Document 1, for example, describes a test apparatus that can decrease testing time for a memory under test that has a repair block for every region. This test apparatus includes a pattern generator that generates a test pattern or the like to be supplied to the memory under test; a logic comparator that compares (i) an output signal output from the memory under test in response to the test pattern to (ii) an expected value signal, and outputs fail data if the output signal does not match the expected value signal; and a plurality of fail counters that count the pieces of fail data for the output signal from the memory under test.

Patent Document 1: Japanese Patent Application Publication No. 2006-012253

A conventional test apparatus includes a plurality of fail counters for counting the number of fails, as described above. However, the fail counts by the fail counters are acquired in a pattern burst containing a plurality of continuous test patterns and the values of the fail counters are read after the pattern burst is finished, thereby obtaining the number of fails in this pattern burst. Accordingly, in order to obtain the number of fails in each test pattern, the data in a fail memory that records the presence of fails in time sequence is used. For example, the number of fails in a certain test pattern can be obtained by reading the data from the fail memory corresponding to this test pattern and processing the read data using a data processing apparatus operating according to software. Since the reading and processing of the fail data happens after the testing, the overall testing time is increased.

Furthermore, when calculating the error rate for each test pattern, it is necessary to know the number of patterns undergoing logic comparison. If the data stored in the fail memory is processed after the testing to calculate the error rate, it is necessary to store all of the data of the logic comparisons in the fail memory, thereby increasing the capacity needed for the fail memory. In other words, the sampling intervals of the logic comparisons depend on the capacity of the fail memory, resulting in long sampling intervals if the fail memory has low capacity.

SUMMARY

In order to solve the above problems, according to a first aspect related to the innovations herein, provided is a test module that tests a device under test, comprising a pattern generating section that generates a test pattern supplied to the device under test and an expected value pattern corresponding to the test pattern, based on a pattern program; an output pattern acquiring section that acquires an output pattern output by the device under test in response to the test pattern; a comparing section that compares the output pattern output and the expected value pattern; a fail counter that counts the number of times the comparing section indicates a mismatch between the output pattern and the expected value pattern; and a control section that controls operation of the fail counter according to control instructions in the pattern program. Also provided is a test module that tests a device under test, comprising a pattern generating section that generates a test pattern supplied to the device under test, based on a pattern program; a comparing section that compares an output pattern output by the device under test to which the test pattern is supplied and an expected value pattern corresponding to the test pattern; a fail counter that counts the number of times the comparing section indicates a mismatch between the output pattern and the expected value pattern; and a control section that controls operation of the fail counter according to control instructions in the pattern program.

The test module may further comprise a check counter that counts the number of comparison bits, which are the bits for which the comparing section compares the output pattern and the expected value pattern, and the control section may further control operation of the check counter according to the control instructions. The comparing section may detect a designated event in the output pattern or the expected value pattern, the test module may further comprise an event counter that counts the number of times that the comparing section detects the event, and the control section may further control operation of the event counter according to the control instructions. The test module may further comprise a control table that records, in association with control codes, control data controlling operation of the fail counter, the check counter, and the event counter, and the control section may acquire from the control table the control data associated with the control code designated by the control instructions, and control the counters according to the acquired control data. The test module may further comprise registers that temporarily store values of the counters and a fail memory that stores the values of the counters, and the control section may reset the counters based on reset data included in the control data, set the values of the counters in the registers based on lock data included in the control data, and write the values set in the registers to the fail memory based on store data included in the control data.

A fail counter, a check counter, and an event counter may be provided for each channel that outputs or receives the test pattern or the output pattern to or from the device under test. In this case, the test module may comprise a plurality of the fail memories that are provided respectively to each counter. Instead, the test module may comprise a plurality of the fail memories that are provided respectively to each channel. The test module may further comprise a calculating section that calculates an error rate based on values of the fail counter and the check counter. The control section may stop operation of the fail counter, the check counter, or the event counter as desired.

According to a second aspect related to the innovations herein, provided is a test method for testing a device under test, comprising generating a test pattern supplied to the device under test and an expected value pattern corresponding to the test pattern, based on a pattern program; acquiring an output pattern output by the device under test in response to the test pattern; comparing the output pattern output and the expected value pattern; counting the number of times the comparing indicates a mismatch between the output pattern and the expected value pattern; and controlling the counting according to control instructions in the pattern program. Also provided is a test method for testing a device under test, comprising generating a test pattern supplied to the device under test, based on a pattern program; comparing an output pattern output by the device under test to which the test pattern is supplied and an expected value pattern corresponding to the test pattern; counting the number of times the comparing indicates a mismatch between the output pattern and the expected value pattern; and controlling the counting according to control instructions in the pattern program.

The test method may further comprise counting the number of comparison bits, which are bits for which the output pattern is compared to the expected value pattern, and the controlling may further include controlling the counting of the number of comparison bits according to the control instructions included in the pattern program. The comparing may include detecting a designated event in the output pattern or the expected value pattern, the test may method further comprise counting the number of times the event is detected, and the controlling may further include controlling the counting of the number of times the event is detected according to the control instructions included in the pattern program. The test method may further comprise storing in a control table, in association with control codes, control data controlling the operations performed when counting the number of times the comparing indicates a mismatch, counting the number of comparison bits, and counting the number of times the event is detected, and the controlling may include acquiring from the control table the control data associated with the control code designated by the control instructions, and controlling the counting operations according to the acquired control data. The test method may further comprise calculating an error rate based on count values from counting the number of times the comparing indicates a mismatch and counting the number of comparison bits.

The summary clause does not necessarily describe all necessary features of the embodiments of the present invention. The present invention may also be a sub-combination of the features described above.

BRIEF DESCRIPTION OF THE DRAWINGS

FIG. 1 shows an exemplary configuration of a test module 100, together with a device under test 200.

DESCRIPTION OF EXEMPLARY EMBODIMENTS

Hereinafter, an embodiment of the present invention will be described. The embodiment does not limit the invention according to the claims, and all the combinations of the features described in the embodiment are not necessarily essential to means provided by aspects of the invention.

FIG. 1 shows an exemplary configuration of a test module 100, together with a device under test (DUT) 200. The test module 100 tests the device under test 200. The test module 100 includes a pattern generating section 110, a pattern output section 112, an output pattern acquiring section 114, a comparing section 116, a counter section 118, a fail memory 120, a calculating section 122, a control section 124, and a control table 126. The counter section 118 includes a check counter 130, a fail counter 132, an event counter 134, registers 136, 138, and 140, and a storing section 142.

The pattern generating section 110 generates a test pattern to be supplied to the device under test 200 and an expected value pattern corresponding to the test pattern, based on a pattern program. The pattern output section 112 outputs the test pattern generated by the pattern generating section 110 to the device under test 200. The output pattern acquiring section 114 acquires an output pattern output by the device under test 200, which was supplied with the test pattern. The comparing section 116 compares the output pattern to the expected value pattern. The comparing section 116 may detect a designated event in the output pattern or the expected value pattern.

The counter section 118 receives the comparison result from the comparing section 116 and counts a value according to the result. A counter section 118 can be included for each measurement channel. The counter section 118 can include a plurality of counters that count different targets, such as the check counter 130, the fail counter 132, and the event counter 134.

The check counter 130 counts the number of bits compared by the comparing section 116 between the expected value pattern and the output pattern. The fail counter 132 counts the number of times fail information is output, and each piece of fail information is output when the comparison between the expected value pattern and the output pattern by the comparing section 116 indicates a mismatch. The event counter 134 counts the number of times that the comparing section 116 detects an event. Each counter, including the check counter 130, the fail counter 132, and the event counter 134, may be provided for each channel that outputs or receives the output pattern or the test pattern to or from the device under test 200.

The registers 136, 138, and 140 temporarily hold a value of the check counter 130, the fail counter 132, and the event counter 134, respectively. The storing section 142 stores the values held in the registers 136, 138, and 140 in the fail memory 120.

The fail memory 120 stores the values of the check counter 130, the fail counter 132, and the event counter 134. A plurality of fail memories 120 can be provided. A plurality of fail memories 120 may be provided to correspond to the check counter 130, the fail counter 132, and the event counter 134. A plurality of fail memories 120 may be provided respectively for the channels.

The calculating section 122 calculates an error rate, based on the values of the fail counter 132 and the check counter 130. The calculating section 122 may calculate a value that expresses the test result, based on the values of the counters in other counter sections 118.

The control section 124 controls the operation of the fail counter 132 according to control instructions in the pattern program. The control section 124 may control the operation of the check counter 130 according to the control instructions. The control section 124 may control the operation of the event counter 134 according to the control instructions. The control section 124 may acquire from the control table 126 control data associated with a control code designated by the control instructions, and control the counters according to the acquired control data.

The control section 124 may reset the counters based on reset data included in the control data. The control section 124 may set the values of the counters in the registers 136, 138, and 140, based on lock data included in the control data. The control section 124 may write the values set in the registers 136, 138, and 140 to the fail memory 120, based on storage data included in the control data. The control section 124 may stop the operation of the fail counter 132, the check counter 130, or the event counter 134 as desired.

The control table 126 records, in association with control codes, the control data indicating the operations of the fail counter 132, the check counter 130, and the event counter 134. Table 1 is an exemplary control table 126.

TABLE 1

| Bit | 11 | 10 | 9 | 8 | 7 | 6 | 5 | 4 | 3 | 2 | 1 | 0 |
|---|---|---|---|---|---|---|---|---|---|---|---|---|
| Data | Event Count | | | | Fail Count | | | | Check Count | | | |
| | Inc | Store | Lock | Reset | Store | Lock | Reset | | Store | Lock | Reset | |

As shown in Table 1, the control table may include 12 bits of binary data, in which the four upper bits are allocated to the control data for the event counter 134, the intermediate four bits are allocated to control data for the fail counter 132, and the lower four bits are allocated to control data for the check counter 130.

The control data for the event counter 134 may include Inc data, Store data, Lock data, and Reset data. The Inc data increments the value of the event counter 134. The Store data stores the value of the register 140 corresponding to the event counter 134 in the fail memory 120. The Lock data stores the current event counter 134 value in the corresponding register 140. The Reset data resets the event counter 134.

The control data of the fail counter 132 may include Store data, Lock data, and Reset data. The Store data stores the value of the register 138 corresponding to the fail counter 132 in the fail memory 120. The Lock data stores the current value of the fail counter 132 in the corresponding register 140. The Reset data resets the fail counter 132.

The control data of the check counter 130 may include Store data, Lock data, and Reset data. The Store data stores the value of the register 136 corresponding to the check counter 130 in the fail memory 120. The Lock data stores the current value of the check counter 130 in the corresponding register 140. The Reset data resets the check counter 130.

With the test module 100 described above, each type of fail data corresponding to the comparison results of the comparing section 116 can be recorded in the counter section 118. For example, the number of comparison bits, which is the number of comparisons, can be counted by the check counter 130, and the number of fails can be counted by the fail counter 132. Furthermore, the events can be designated by control data, which can be designated using control instructions, and the number of event detections can be counted by the event counter 134. The values counted by these counters can be written to the fail memory 120 at any timing and used in the calculation by the calculating section 122, according to the control data.

As a result, the number of comparisons and the number of fails can be counted from when a test pattern begins to when the test pattern ends, for example, and the error rate of this test pattern can be calculated. Since the values recorded by the counters are used in the error rate calculation, not all the comparison results need to be recorded in the fail memory 120, and the memory capacity of the fail memory 120 can be lower.

While the embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

What is claimed is:

1. A test module that tests a device under test, comprising:
    a pattern generating section that generates a test pattern supplied to the device under test, based on a pattern program;
    a comparing section that compares an output pattern output by the device under test to which the test pattern is supplied and an expected value pattern corresponding to the test pattern and outputs a comparison result;
    a fail counter that receives the comparison result output by the comparing section and counts the number of times the comparing section indicates a mismatch between the output pattern and the expected value pattern;
    a check counter that receives the comparison result output by the comparing section and counts the number of comparison bits, which are the bits for which the comparing section compares the output pattern and the expected value pattern; and
    a control section that controls operation of the fail counter and the check counter according to control instructions in the pattern program.

2. The test module according to claim 1, wherein
    the comparing section detects a designated event m the output pattern or the expected value pattern,
    the test module further comprises an event counter that counts the number of times that the comparing section detects the event, and
    the control section further controls operation of the event counter according to the control instructions.

3. The test module according to claim 2, further comprising a control table that records, in association with control codes, control data controlling operation of the fail counter, the check counter, and the event counter, Wherein
    the control section acquires from the control table the control data associated with the control code designated by the control instructions, and controls the counters according to the acquired control data.

4. The test module according to claim 3, further comprising registers that temporarily store values of the counters and a fail memory that stores the values of the counters, wherein
    the control section resets the counters based on reset data included in the control data, sets the values of the counters in the registers based on lock data included in the control data, and writes the values set in the registers to the fail memory based on store data included in the control data.

5. The test module according to claim 3, wherein
    the control table includes a plurality of binary data in which upper bits, intermediate bits, and lower bits are allocated respectively to different members of the group consisting of the control data controlling operation of the event counter, the control data controlling operation of the fail counter, and the control data controlling operation of the check counter.

6. The test module according to claim 2, wherein
    the control section stops operation of the fail counter, the check counter, or the event counter as desired.

7. The test module according to claim 2, wherein
    a fail counter, a check counter, and an event counter are provided fur each channel that outputs or receives the test pattern or the output pattern to or from the device under test.

8. The test module according to claim 2, comprising a plurality of the fail memories that store the values of the fail counter, the check counter, and the event counter, wherein
the plurality of fail memories are provided, respectively to the fail counter, the check counter, and the event counter.

9. The test module according to claim 2, comprising a plurality of the fail memories that store the values of the fail counter, the check counter, and the event counter, wherein
the plurality of fail memories are provided respectively to channels that output or receive the test pattern or the output pattern to or from the device under test.

10. The test module according to claim 1, further comprising a calculating section that calculates an error rate based on values of the fail counter and the check counter.

11. A test method for testing a device under test, comprising:
generating a test pattern supplied to the device under test, based on a pattern program;
comparing an output pattern output by the device under test to which the test pattern is supplied and an expected value pattern corresponding to the test pattern to output a comparison result;
counting the number of times the comparing indicates a mismatch between the output pattern and the expected value pattern based on the comparison result output in the comparing;
counting the number of comparison bits, which are bits for which the output pattern is compared to the expected value pattern based on the comparison result output in the comparing; and
controlling the counting the number of times and the counting the number of comparison bits according to control instructions in the pattern program.

12. The test method according to claim 11, wherein
the comparing includes detecting a designated event in the output pattern or the expected value pattern,
the test method further comprises counting the number of times the event is detected, and
the controlling further includes controlling the counting of the number of times the event is detected according to the control instructions included in the pattern program.

13. The test method according to claim 12, further comprising storing in a control table, in association with control codes, control data controlling the operations performed when counting the number of times the comparing indicates a mismatch, counting the number of comparison bits, and counting the number of times the event is detected, wherein
the controlling includes acquiring from the control table the control data associated with the control code designated by the control instructions, and controlling the counting operations according to the acquired control data.

14. The test method according to claim 11, further comprising, calculating. an error rate based on count values from counting the number of times the comparing indicates a mismatch and counting the number of comparison bits.

* * * * *